US005528076A

United States Patent [19]
Pavio

[11] Patent Number: 5,528,076
[45] Date of Patent: Jun. 18, 1996

[54] LEADFRAME HAVING METAL IMPREGNATED SILICON CARBIDE MOUNTING AREA

[75] Inventor: Jeanne S. Pavio, Phoenix, Ariz.

[73] Assignee: Motorola, Inc., Schaumburg, Ill.

[21] Appl. No.: 382,102

[22] Filed: Feb. 1, 1995

[51] Int. Cl.$^6$ ................................................ H01L 23/495
[52] U.S. Cl. .................... 257/666; 257/676; 257/677; 257/787
[58] Field of Search .......................... 257/77, 675, 787, 257/669, 676, 677, 666

[56] References Cited

U.S. PATENT DOCUMENTS 5,014,113  5/1991  Casto ........................................ 257/669

OTHER PUBLICATIONS

"Metal Matrix Composites for Electronic Packaging" by Carl Zweber JOM, vol. 44 Iss. 7 pp. 15–23 Jul. 1992.

Primary Examiner—William Mintel
Assistant Examiner—Roy Potter
Attorney, Agent, or Firm—Miriam Jackson

[57] ABSTRACT

A leadframe (10) formed by a method including providing a preform of silicon carbide, placing the preform in a mold, injecting a liquefied metal, such as aluminum, into the mold to fill the mold and infiltrate the preform, using heat and pressure. The mold defines a mounting area (12) in which the preform is positioned, and a plurality of leads (20, 22, 28, 29).

10 Claims, 2 Drawing Sheets

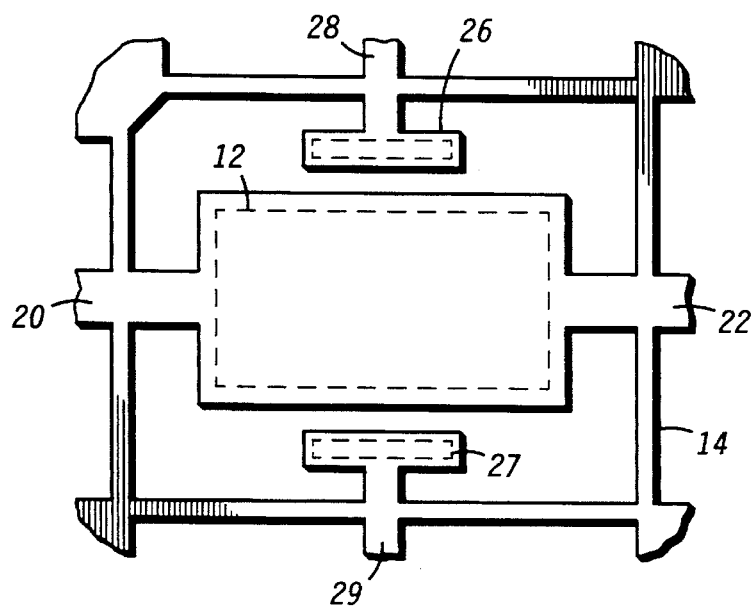
FIG. 1
FIG. 2
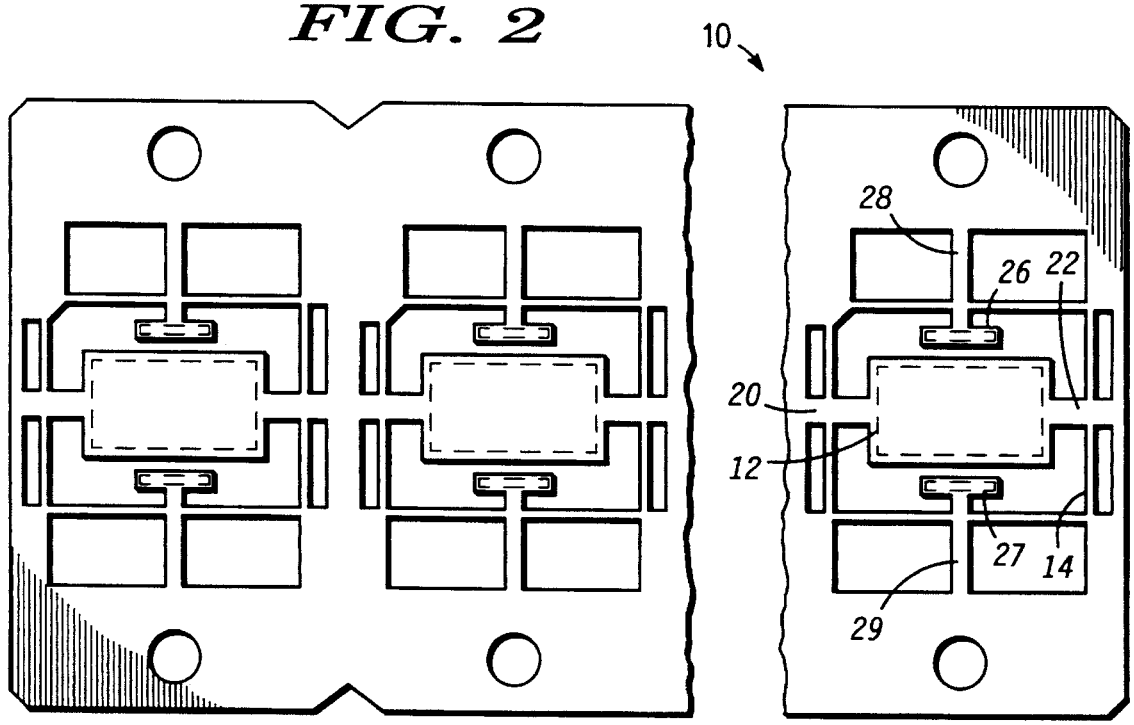

LEADFRAME HAVING METAL IMPREGNATED SILICON CARBIDE MOUNTING AREA

FIELD OF THE INVENTION

This invention relates to semiconductor packaging and, more particularly, the present invention relates to an improved leadframe.

BACKGROUND OF THE INVENTION

In the electronics industry a semiconductor die will often be mounted on a leadframe and encapsulated for protection from atmospheric conditions as well as mechanical damage. The leadframe may be inexpensively stamped from a sheet of electrically conductive material such as copper. The finished component is inexpensive when compared with other packaging methods, and quickly produced.

While a simple leadframe may be sufficient for some semiconductor dies, many semiconductor dies often generate heat which must be dispelled. To dispel this heat a heat sink is employed. The heat sink must be thermally conductive to carry the heat from the semiconductor die. Generally a metal is used for this element. This is where problems with current leadframes develop. In order to dispel the generated heat, the heat sink must be in contact with the semiconductor die or coupled thereto by a thermally conductive material. It is conventional practice to form a back metal on a semiconductor die so that the die can be soldered to a heat sink. Current techniques in leadframe technology utilize copper as the leadframe material, having a mounting area on which a die is mounted. Copper provides good thermal conductivity at a low cost and may act as a heat sink or couple the die to the heat sink. While the heat sink effectively carries heat from the die, the coefficient of thermal expansion (CTE) of the die is much less than the heat sink or copper mounting area. This mismatch in CTE may result in damage to the die or the bond holding the die to the heat sink during temperature cycling. In very small devices the differences in the CTE may not result in any damage, but as the size of the die increases, the mismatch in CTE becomes very important.

The problems mentioned above are prevalent in silicon semiconductor dies over 0.150 inches on a side, and are compounded when a gallium arsenide (GaAs) die is employed. GaAs dies are thin and extremely brittle. The CTE mismatch with copper causes breakage of the die as stresses are relieved and differential expansion and contraction occurs. While GaAs dies no larger than 0.050 inches on a side may be mounted on a copper leadframe, larger dies will be damaged. Due to the need for more functionality and more power, small dies are the extreme minority today.

It would be highly advantageous, therefore, to remedy the foregoing and other deficiencies inherent in the prior art.

Accordingly, it is an object of the present invention to provide a new and improved leadframe.

Another object of the present invention is to provide a leadframe having a CTE substantially matched to silicon and GaAs.

And another object of the present invention is to provide a leadframe having good thermal conductivity for high power.

Still another object of the present invention is to provide a leadframe which is relatively inexpensive.

Yet another object of the present invention is to provide a lightweight leadframe.

Yet another object of the present invention is to provide a leadframe which can be employed with GaAs dies.

SUMMARY OF THE INVENTION

Briefly, to achieve the desired objects of the present invention in accordance with a preferred embodiment thereof, provided is a method of fabricating a leadframe including the steps of providing a preform of silicon carbide, placing the preform in a mold, injecting a liquefied metal into the mold to fill the mold and infiltrate the preform, and subjecting the mold and the metal to heat and pressure. The mold defines a mounting area in which the preform is positioned, and a plurality of leads.

In a specific embodiment, a method a fabricating a semiconductor package is disclosed which includes the steps of providing a leadframe having a mounting area formed of aluminum silicon carbide with a plurality of aluminum leads, placing a semiconductor device on the mounting area, and encapsulating the semiconductor device and leadframe with the plurality of leads and an opposing surface of the mounting area exposed.

Further, a leadframe for semiconductor devices is disclosed which includes a semiconductor device mounting area formed of a metal impregnated silicon carbide and having a coefficient of thermal expansion substantially similar to a semiconductor material, and a plurality of electrically conductive leads integrally formed with the mounting area.

In a specific embodiment, a semiconductor package is disclosed including a semiconductor device, a leadframe with a semiconductor device mounting area formed of a metal impregnated silicon carbide and having a coefficient of thermal expansion substantially similar to a semiconductor material and a plurality of electrically conductive leads integrally formed with the mounting area, and an encapsulating material surrounding the device and the mounting area with leads and an opposing surface exposed.

BRIEF DESCRIPTION OF THE DRAWINGS

The foregoing and further and more specific objects and advantages of the instant invention will become readily apparent to those skilled in the art from the following detailed description of a preferred embodiment thereof, taken in conjunction with the drawings, in which:

FIG. 1 is a top plan of a leadframe constructed in accordance with the teachings of the present invention;

FIG. 2 is a top plan of a mold for a plurality of leadframes, as shown in FIG. 1, in a manufacturing configuration.

DETAILED DESCRIPTION OF THE DRAWINGS

Figure 3:
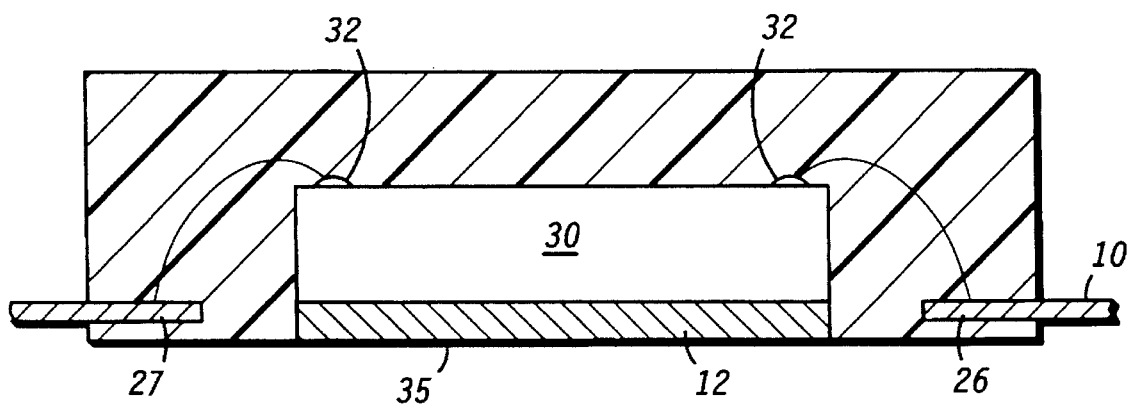
FIG. 3 is a sectional side view of a semiconductor package in accordance with the teachings of the present invention.

Turning now to the drawings in which like reference characters indicate corresponding elements throughout the several views, attention is first directed to FIG. 1 which illustrates a leadframe generally designated 10. Leadframe 10 includes a semiconductor die mounting area 12 formed of a metal impregnated material having a coefficient of thermal expansion substantially similar to a semiconductor material, such as silicon, gallium arsenide, silicon carbide, etc. Generally, the coefficient of thermal expansion of the mounting area is less than or equal to approximately 10 parts per million per degree Celsius. Also, in the preferred embodiment, mounting area 12 is formed of material which is a good heat conductor, generally greater than 170 watts per meter degree Celcius, such as silicon carbide. Leadframe 10 further includes a plurality of electrically conductive leads (to be described in more detail presently) integrally formed with or coupled to a portion of mounting area 12 and a frame 14 forming an interconnected network with the leads in order to maintain structural integrity during fabrication and assembly. After encapsulation, which will be described below, frame 14 is trimmed in a well known manner, separating individual the leads from one another.

In the specific embodiment illustrated in FIG. 1, semiconductor die mounting area 12 is substantially rectangular and preferably formed of aluminum silicon carbide (e.g., silicon carbide impregnated with aluminum) which has very good thermal conductivity and a coefficient of thermal expansion substantially similar to that of semiconductor material such as gallium arsenide, silicon, etc. Preferably, the coefficient of thermal expansion of mounting area 12 is less than approximately 8 parts per million. It will be understood that other metals, such as copper, may be employed, but it has been found that aluminum provides the desired characteristics and is therefore preferred. A pair of leads 20 and 22 extend from opposite ends of mounting area 12 and can be used as a common connection, such as ground, for circuitry formed in semiconductor dies mounted on mounting area 12.

Two bonding pads 26 and 27 are positioned with one each on opposing sides of mounting area 12 and spaced from mounting area 12, for receiving connecting wires which will be described in more detail below. Two leads 28 and 29 extend from bonding pads 26 and 27, respectively. In some embodiments, bonding pads may be positioned under, or close enough to a semiconductor die mounted on mounting area 12 to make it desirable to have a coefficient of thermal expansion similar to the semiconductor die. In the embodiment illustrated, for example, bonding pads 26 and 27 are also formed of aluminum impregnated silicon carbide so that they will not create stress on the package after encapsulation.

Each of leads 20, 22, 28 and 29 are formed of a bendable metal, preferably aluminum. While leads 20, 22, 28 and 29 and frame 10 may be formed from aluminum silicon carbide as is mounting area 12, a bendable metal is preferred because for most applications leads 20, 22, 28 and 29 are bent upon completion of a semiconductor package and for a specific application in mind. Aluminum silicon carbide, as a final product, is rigid and cannot be bent as desired, but must be formed in the desired configuration. This is however a viable option and is contemplated by this invention.

Generally, a leadframe 10 including a plurality of semiconductor die mounting areas 12, as illustrated in FIG. 2, is utilized in the manufacturing process. Preforms of a preferred material, such as silicon carbide, are formed in any convenient manner, such as molding. The preforms are relatively porous and flexible so as to be easy to handle during subsequent operations. In a preferred embodiment of the leadframe fabricating process, a plurality of preforms are positioned in a mold at various designated positions for mounting areas 12 and (in this specific embodiment) at designated positions for bonding pads 26 and 27. The mold is then closed and a selected liquefied metal, such as aluminum in a liquid state, is injected into the mold so as to infiltrate or impregnate the porous preforms and fill areas of the mold which define and leads 20, 22, 28 and 29 and frame 14. Alternatively, it is possible that the metal may be formed surrounding all of the preforms and subsequently, leads 20, 22, 28, 29 and frame 14 may be formed by stamping out portions of the metal. The stamping process is well known n the art. In a preferred embodiment, the mold is subjected to heat and pressure during the infiltration. Typical temperatures and pressures used are well known in the art and will vary depending on the size of the mold, as well as other parameters. In this embodiment, leadframe 10 is comprised of aluminum silicon carbide mounting area 12 and bonding pads 27 and aluminum leads 20, 22, 28 and 29 and frame 14.

A further specific example of a method of fabricating a semiconductor package includes providing a leadframe having a mounting area formed of aluminum silicon carbide with a plurality of aluminum leads. The leadframe may be provided by a method generally as explained above. A semiconductor die 30 is positioned on the mounting area 12 of the leadframe 10 as illustrated in FIG. 3. Semiconductor die 30 is affixed to the upper surface of mounting area 12 by any convenient means, generally known in the art. If, for example, the rear or lower surface of semiconductor die 30 forms one terminal of the device, a metal backing layer (e.g., gold or the like) is applied to semiconductor die 30 and semiconductor die 30 is soldered to mounting area 12. If the rear or lower surface of semiconductor die 30 does not form one terminal of the device, semiconductor die 30 can be attached to mounting area 12 by, for example, a thin layer of adhesive. In this instance, the adhesive should be either heat conducting or be thin enough to allow heat to travel freely from semiconductor die 30 to mounting area 12.

Other electrical terminals of electronic circuitry on semiconductor die 30, designated 32 in FIG. 3, are electrically connected to bonding pads 26 and 27 by some convenient method, such as wire bonding or the like. In the event the rear or lower surface of semiconductor die 30 is a terminal of the device or circuit, leads 20 and 22 provide an external connection thereto through the aluminum impregnated mounting area 12 and the metal backing on semiconductor die 30. Also, leads 28 and 29, which are internally connected to bonding pads 26 and 27, respectively, provide external electrical connections to the other electrical terminals of the device or circuit on semiconductor die 30.

With semiconductor die 30 fixedly and thermally attached to mounting area 12 of leadframe 10, and with the terminals electrically connected to bonding pads 26 and 27, the entire apparatus is encapsulated using some convenient material, such as plastic, in any well known method. Leads 20, 22, 28 and 29, which may be formed of bendable aluminum, extend from the package and are available for later forming, as required by the specific application of the semiconductor device or circuit. Also, in this preferred embodiment, because mounting area 12 is formed of material which is a good heat conductor, the encapsulation is performed so that an opposing, or lower, surface 35 of mounting area 12 is exposed and is not encapsulated. In applications where semiconductor die 30 includes high power devices or circuits generating large amounts of heat and power, the package can be mounted on a printed circuit board or the like with surface 35 of mounting area 12 in thermal contact with a heat sink (not shown) to aid in carrying heat from the package.

Thus, a new and improved leadframe and method of fabrication have been disclosed. The new leadframe has the advantage of a coefficient of thermal expansion which is similar to silicon and gallium arsenide, so that relatively large semiconductor chips of silicon and gallium arsenide can be affixed directly to the leadframe without danger of damage during heat cycling. Also, the new and improved leadframe has good thermal properties, generally greater than 170 watts per meter degree Celsius, which allows the leadframe either to operate directly as a heat sink or to be thermally connected to additional heat sinks. Further, because the mounting area of the leadframe is formed of a lighter material than metal, the entire structure is lighter and less expensive than prior art packages. In addition, the leadframes can be inexpensively and easily manufactured in large quantities.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A leadframe for semiconductor devices comprising:
   a semiconductor device mounting area formed of a metal impregnated silicon carbide; and
   a plurality of electrically conductive leads substantially comprised of a metal coupled to said mounting area.

2. A leadframe as claimed in claim 1 wherein the metal is comprised of aluminum.

3. A leadframe as claimed in claim 1 wherein the coefficient of thermal expansion of the mounting area is substantially similar to the coefficient of thermal expansion of gallium arsenide.

4. A leadframe as claimed in claim 1 wherein the coefficient of thermal expansion of the mounting area is substantially similar to the coefficient of thermal expansion of silicon.

5. A leadframe as claimed in claim 1 wherein the coefficient of thermal expansion of the mounting area is less than or equal to approximately 10 parts per million per degree Celsius.

6. A semiconductor package comprising: a semiconductor device having electrical terminals;
   a leadframe including a semiconductor device mounting area with a first surface and an opposing surface, formed of a metal impregnated silicon carbide and having a coefficient of thermal expansion substantially similar to a semiconductor material and a plurality of electrically conductive leads integrally formed with said mounting area, said plurality of electrically condutuctive leads comprised substantially of a metal;
   the semiconductor device being mounted on the mounting area of the leadframe with at least some of the electrical terminals electrically connected to the plurality of electrically conductive leads; and
   an encapsulating material surrounding the device and the mounting area with leads and the opposing surface exposed.

7. A semiconductor package as claimed in claim 6 wherein said semiconductor device includes a gallium arsenide chip being larger than 0.050 inches by 0.050 inches.

8. A semiconductor package as claimed in claim 6 wherein said semiconductor device includes a silicon chip being larger than 0.150 inches by 0.150 inches.

9. A semiconductor package as claimed in claim 8 wherein the metal is comprised of aluminum.

10. A semiconductor package as claimed in claim 6 wherein the encapsulating material is comprised of plastic.

* * * * *